(12) United States Patent
Chu

(10) Patent No.: US 7,693,003 B2
(45) Date of Patent: Apr. 6, 2010

(54) SEMICONDUCTOR PACKAGE

(75) Inventor: Shin Ho Chu, Icheon-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 281 days.

(21) Appl. No.: 11/819,272

(22) Filed: Jun. 26, 2007

(65) Prior Publication Data

US 2008/0186798 A1 Aug. 7, 2008

(30) Foreign Application Priority Data

Feb. 6, 2007 (KR) .................. 10-2007-0012123

(51) Int. Cl.
*G11C 8/00* (2006.01)
(52) U.S. Cl. ............... 365/230.06; 365/63; 365/189.03; 365/189.17
(58) Field of Classification Search ............ 365/230.06, 365/63, 189.03, 189.17
See application file for complete search history.

(56) References Cited

U.S. PATENT DOCUMENTS

| | | | | |
|---|---|---|---|---|
| 5,066,831 A | * | 11/1991 | Spielberger et al. | ......... 174/262 |
| 5,254,482 A | * | 10/1993 | Fisch | ............................. 438/3 |
| 5,272,664 A | * | 12/1993 | Alexander et al. | ............. 365/52 |
| 5,751,015 A | * | 5/1998 | Corbett et al. | ................ 257/48 |
| 5,768,584 A | | 6/1998 | MacDonald et al. | |
| 5,987,623 A | * | 11/1999 | Ushida | .......................... 714/6 |
| 6,184,713 B1 | * | 2/2001 | Agrawal et al. | ............... 326/41 |
| 6,356,958 B1 | * | 3/2002 | Lin | ............................... 710/1 |
| 6,555,398 B1 | * | 4/2003 | Lin | ............................ 438/14 |
| 6,705,877 B1 | * | 3/2004 | Li et al. | ........................ 439/74 |
| 6,882,171 B2 | * | 4/2005 | Ong | .......................... 324/765 |
| 7,061,263 B1 | * | 6/2006 | Ong | .......................... 324/765 |
| 7,114,659 B2 | * | 10/2006 | Harari et al. | ................. 235/492 |
| 7,285,980 B2 | * | 10/2007 | Bansal et al. | ................. 326/38 |

FOREIGN PATENT DOCUMENTS

JP 2005-317830 A 11/2005
KR 10-0597787 B1 6/2006

* cited by examiner

*Primary Examiner*—Viet Q Nguyen
(74) *Attorney, Agent, or Firm*—IP & T Law Firm PLC (57) ABSTRACT

A semiconductor package facilitates package connection due to different locations of input/output pads in each interlayer die depending on coding information in a multi-chip package. The semiconductor package includes many chips. Each of the chips includes: input/output pads configured to input and output data having a given bandwidth; a decoding pad configured to receive coding information; and a code control unit configured to decode the coding information and to enable an input/output pad positioned at a specific location among the input/output pads according to the decoding result.

13 Claims, 10 Drawing Sheets

SEMICONDUCTOR PACKAGE

CROSS-REFERENCES TO RELATED APPLICATIONS

The present application claims the benefit of priority of Korean patent application number 10-2007-12123, filed on Feb. 6, 2007, the entire contents of which are incorporated herein by reference.

BACKGROUND

The present invention generally relates to a semiconductor package, and more specifically, to a technology of differentiating locations of input/output pads in an interlayer die depending on coding information in a multi-chip package to facilitate package connection.

Due to high performance of electronic devices, various techniques for providing semiconductor modules of high capacity have been developed. In order to enhance the capacity of semiconductor modules, high integration of devices, stack-structured packaging methods, and methods for reducing the package size so as to mount more packages on a printing circuit board have been provided. As a result, various kinds of packages, such as Thin Small Outline Package (TSOP), Fine Pitch Ball Grid Array (FBGA), and Multi Chip Package (MCP), have been developed.

Also, due to speed-up and scale-down of the multimedia system, the component parts thereof become smaller. For example, semiconductor integrated circuits (IC) become smaller through reduction of memory chips, and several chips are mounted in one package to increase board packing efficiency.

MCP refers to a package including several chips each having a different function in that package. Each chip of the MCP is attached to one substrate, and connected electrically with each other to perform a function. The multi-chip packaged semiconductor device can include a plurality of semiconductor devices in one package, thereby reducing the size of the system.

SUMMARY

Various embodiments consistent with the present invention are directed to enabling input/output pads positioned at different locations in each die depending on coding information in the same bandwidth in a stack or multi-chip package to facilitate package connection.

A semiconductor package includes a plurality of chips. Each of the plurality of chips includes input/output pads configured to input and output data having a given bandwidth, a decoding pad configured to receive coding information, and a code control unit configured to decode the coding information and to enable an input/output pad positioned at a specific location among the input/output pads according to the decoding result.

DETAILED DESCRIPTION OF THE EXEMPLARY EMBODIMENTS

The present invention will be described in detail with reference to the accompanying drawings.

Figure 1A:
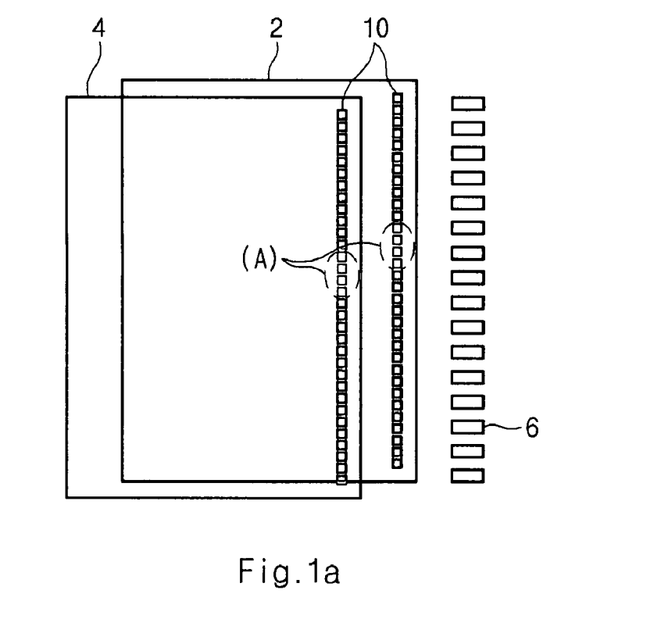
FIGS. 1a through 1c are diagrams illustrating the connection structure of input/output pads in a conventional semiconductor package.
Figure 1B:
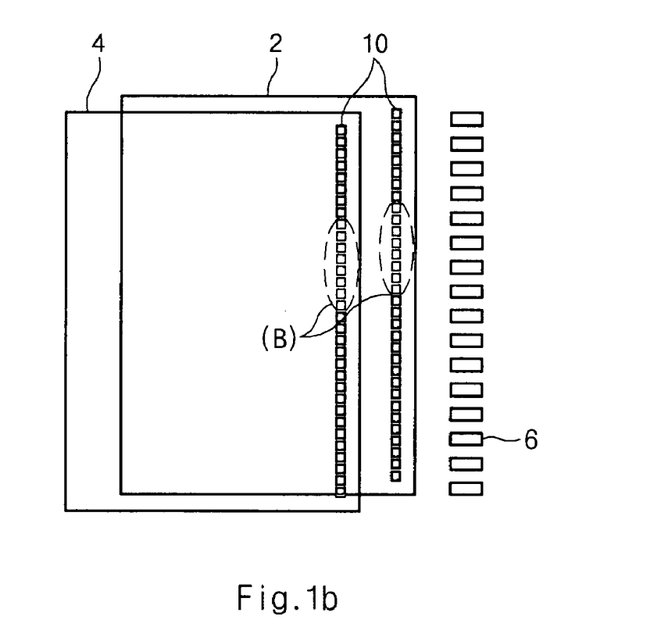
Figure 1C:
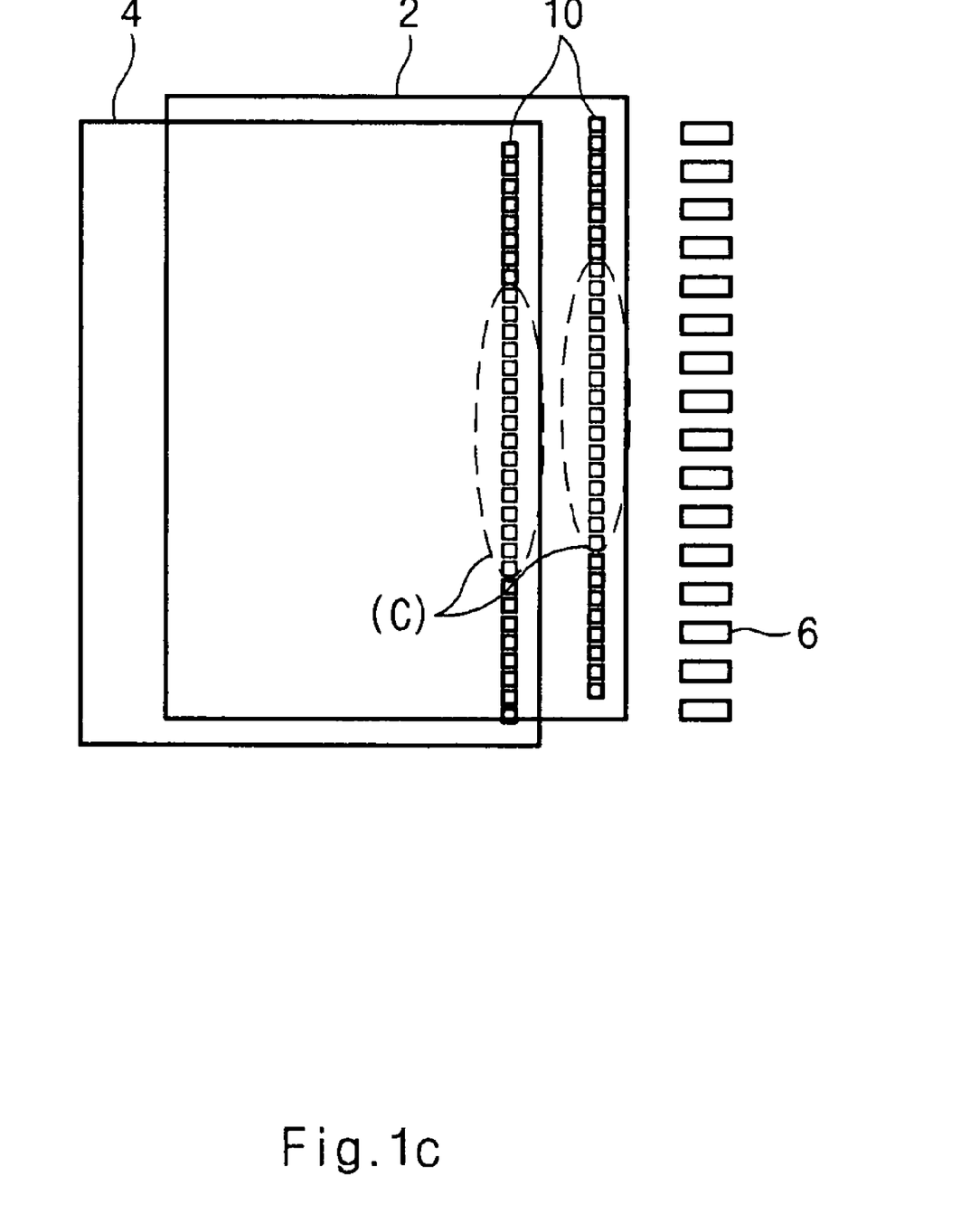

FIGS. 1a through 1c illustrate a connection structure of input/output pads in a conventional semiconductor package.

FIG. 1a shows a multi-chip package having a two-layered chip structure, the data bandwidth of which is ×4. A semiconductor device of FIG. 1a has a double layered chip (2 and 4) structure. Each of chips 2 and 4 includes an input/output pad 10 for inputting and outputting data. Input/output pad 10 is electrically connected to a bond finger 6 outside of chips 2 and 4 through a metal wire (not shown).

FIG. 1b shows a multi-chip package having a two-layered chip structure, the data bandwidth of which is ×8. A semiconductor device of FIG. 1b has a double layered chip (2 and 4) structure. Each of chips 2 and 4 includes an input/output pad 10 for inputting and outputting data.

FIG. 1c shows a multi-chip package having a two-layered chip structure, the data bandwidth of which is ×16. A semiconductor device of FIG. 1c has a double layered chip (2 and 4) structure. Each of chips 2 and 4 includes an input/output pad 10 for inputting and outputting data.

In a conventional multi-chip package, input/output pads 10 positioned at the same locations A, B, and C of first chip 2 and second chip 4 are enabled at the same time, so that the input/output operation of data is performed. For example, in first chip 2 and second chip 4, the data bandwidth of which is ×4, input/output pads 10 positioned at the same location A are enabled so as to input and output data DQ12~DQ15. As a result, when the bandwidth of data is determined in the stack or multi-chip package, it is not easy to interconnect input/output pad 10 to bond finger 6.

Figure 2A:
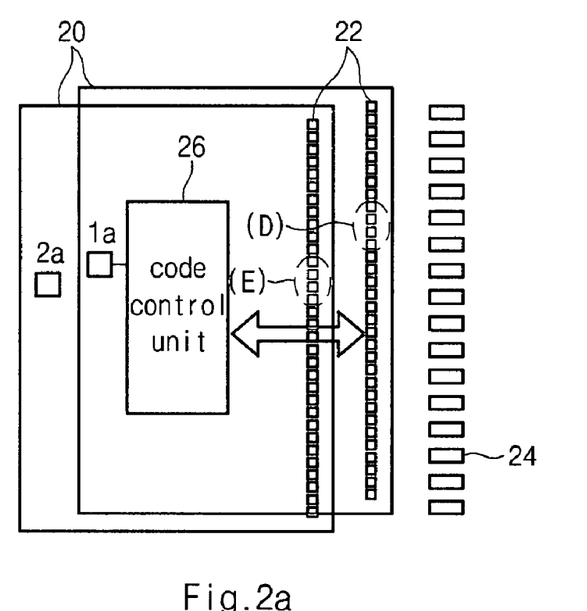
FIGS. 2a through 2c are diagrams illustrating the connection structure of input/output pads in a semiconductor package (×4) according to an embodiment consistent with the present invention.
Figure 2B:
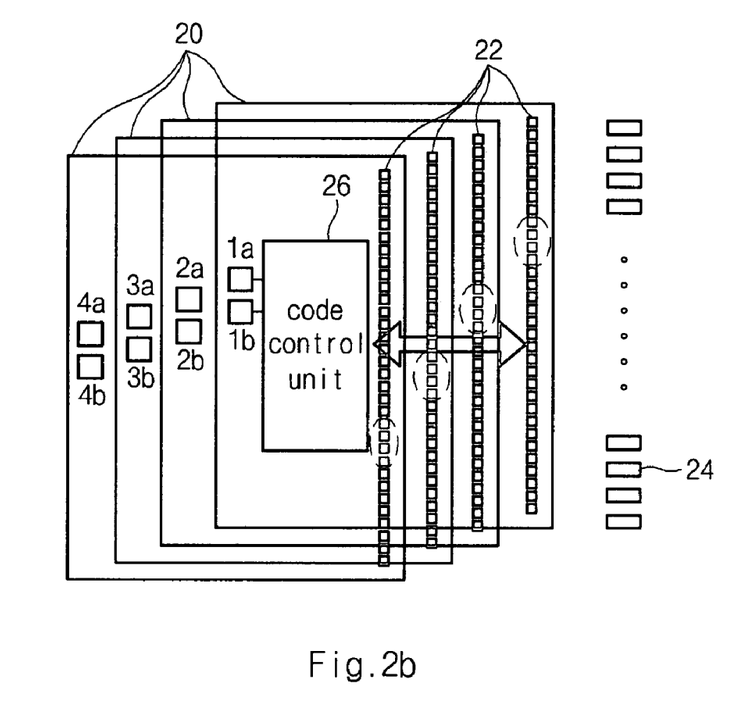
Figure 2C:
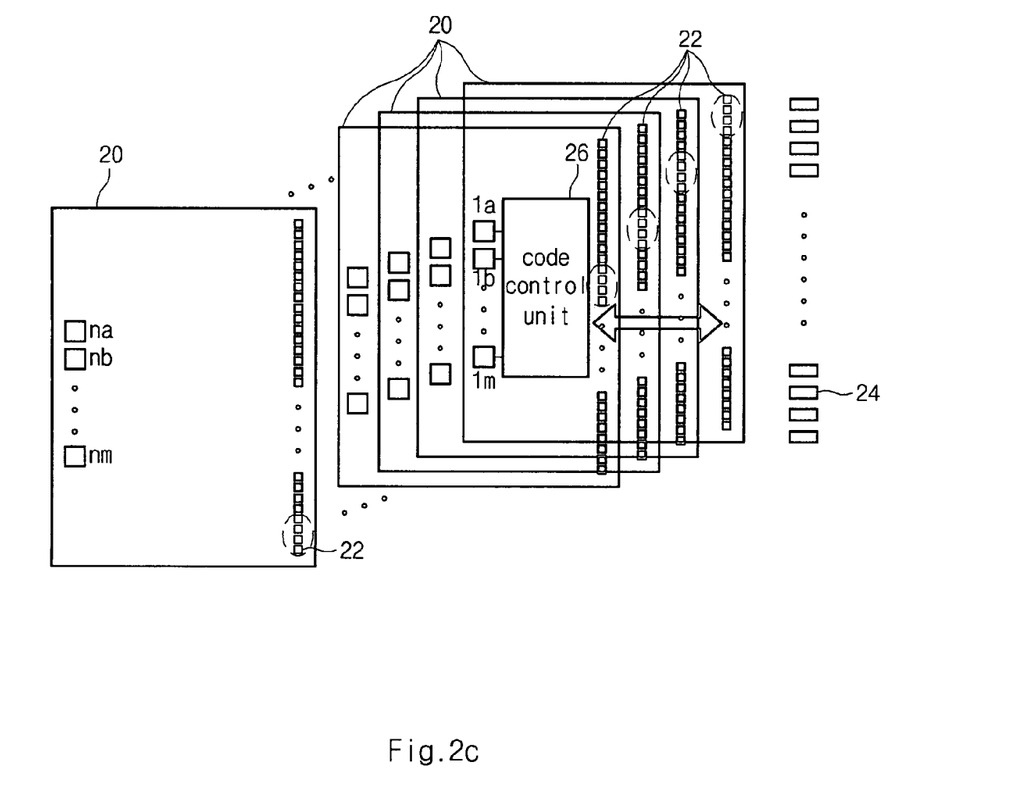

FIGS. 2a through 2c illustrate the connection structure of input/output pads in a semiconductor package (×4) according to an embodiment consistent with the present invention.

FIG. 2a shows a multi-chip package having a two-layered chip structure, the data bandwidth of which is ×4. A semiconductor device of FIG. 2a has a double layered chip 20 structure. Each of chips 20 includes an input/output pad 22 for inputting and outputting data. Input/output pad 22 is electrically connected to a bond finger 24 through a metal wire (not shown).

FIG. 2b shows a multi-chip package having a four-layered chip structure, the data bandwidth of which is ×4. A semiconductor device of FIG. 2b has a four-layered chip 20 structure. Each of chips 20 includes an input/output pad 22 for inputting and outputting data.

FIG. 2c shows a multi-chip package having an n-layered chip structure, the data bandwidth of which is ×4. A semiconductor device of FIG. 2c has an n-layered chip 20 structure. Each of chips 20 includes an input/output pad 22 for inputting and outputting data.

Each chip 20 includes a code control unit 26 for enabling input/output pads 22 positioned at different locations in each die depending on coding information. Each chip 20 includes decoding pads 1a~na, 1m~nm for providing coding information to code control unit 26.

Figure 3A:
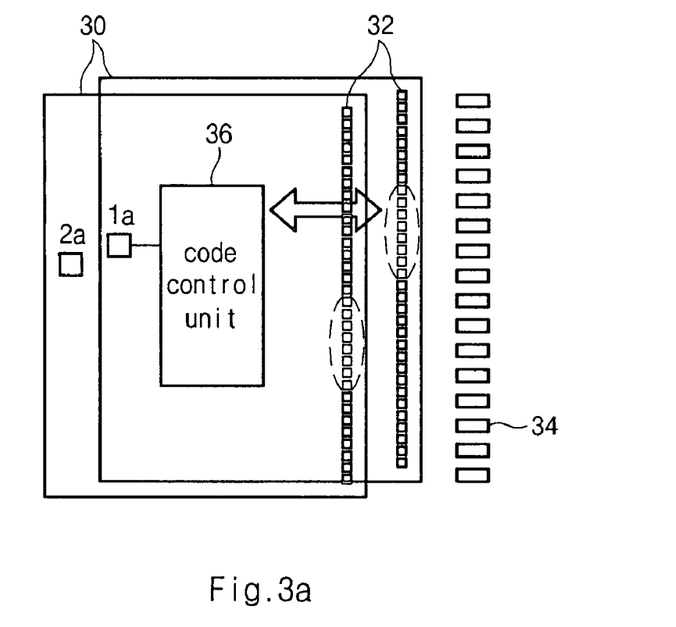
FIGS. 3a through 3c are diagrams illustrating the connection structure of input/output pads in a semiconductor package (×8) according to an embodiment consistent with the present invention.
Figure 3B:
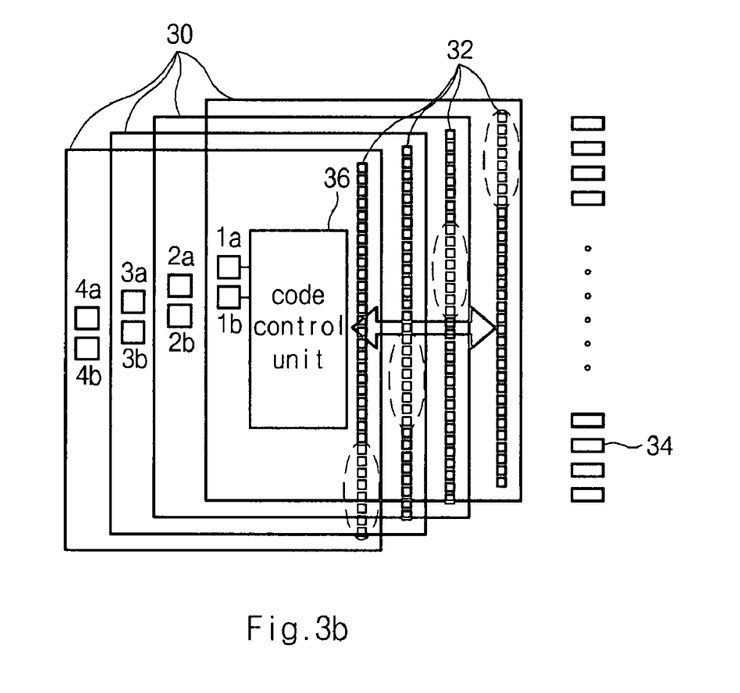
Figure 3C:
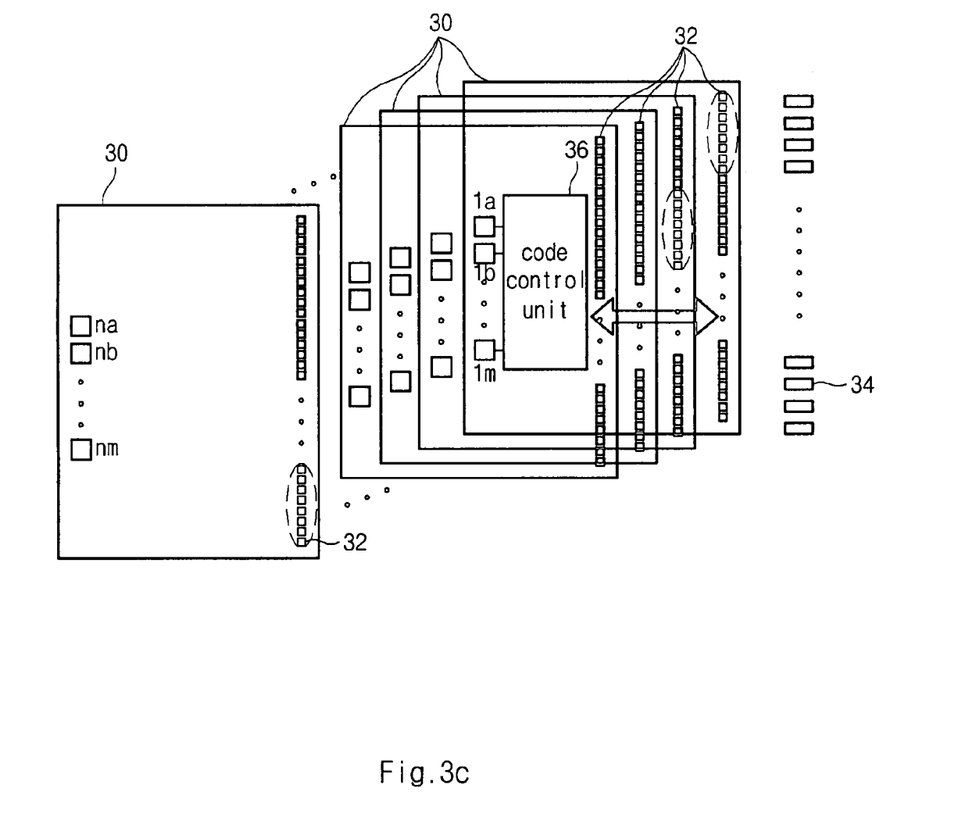

FIGS. 3a through 3c are diagrams illustrating the connection structure of input/output pads in a semiconductor package (×8) according to an embodiment consistent with the present invention.

FIG. 3a shows a multi-chip package having a two-layered chip structure, the data bandwidth of which is ×8. A semiconductor device of FIG. 3a has a double layered chip 30 structure. Each of chips 30 includes an input/output pad 32 for inputting and outputting data. Input/output pad 32 is electrically connected to a bond finger 34 through a metal wire (not shown).

FIG. 3b shows a multi-chip package having a four-layered chip structure, the data bandwidth of which is ×8. A semiconductor device of FIG. 3b has a four-layered chip 30 structure. Each of chips 30 includes an input/output pad 32 for inputting and outputting data.

FIG. 3c shows a multi-chip package having an n-layered chip structure, the data bandwidth of which is ×8. A semiconductor device of FIG. 3c has an n-layered chip 30 structure. Each of chips 30 includes an input/output pad 32 for inputting and outputting data.

Each chip 30 includes a code control unit 36 for enabling input/output pads 32 positioned at different locations in each die depending on coding information. Each chip 30 includes decoding pads 1a~na, 1m~nm for providing coding information to code control unit 36.

Figure 4A:
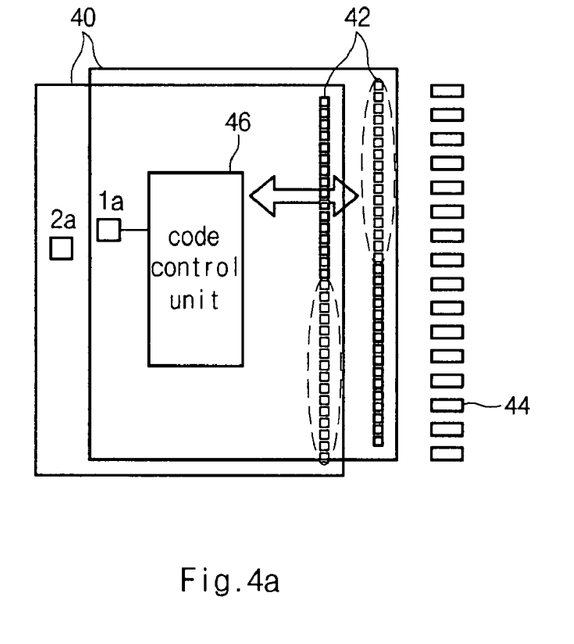
FIGS. 4a through 4c are diagrams illustrating the connection structure of input/output pads in a semiconductor package (×16) according to an embodiment consistent with the present invention.
Figure 4B:
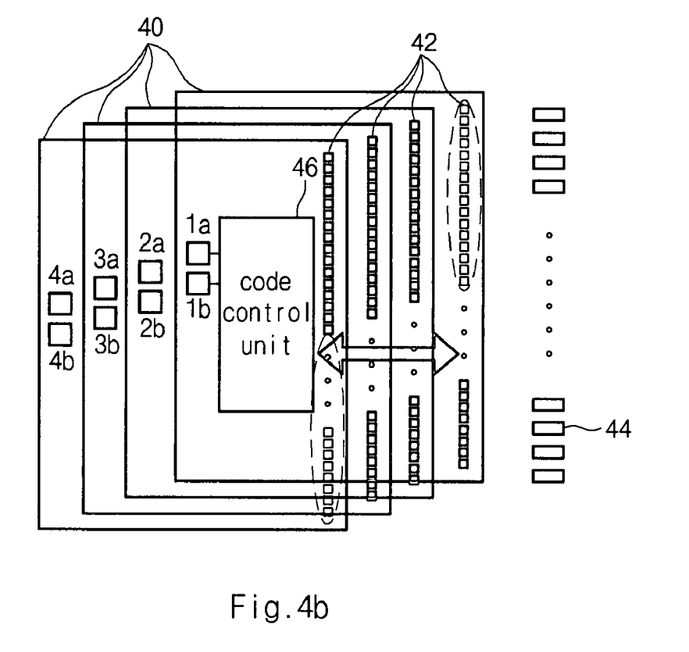
Figure 4C:
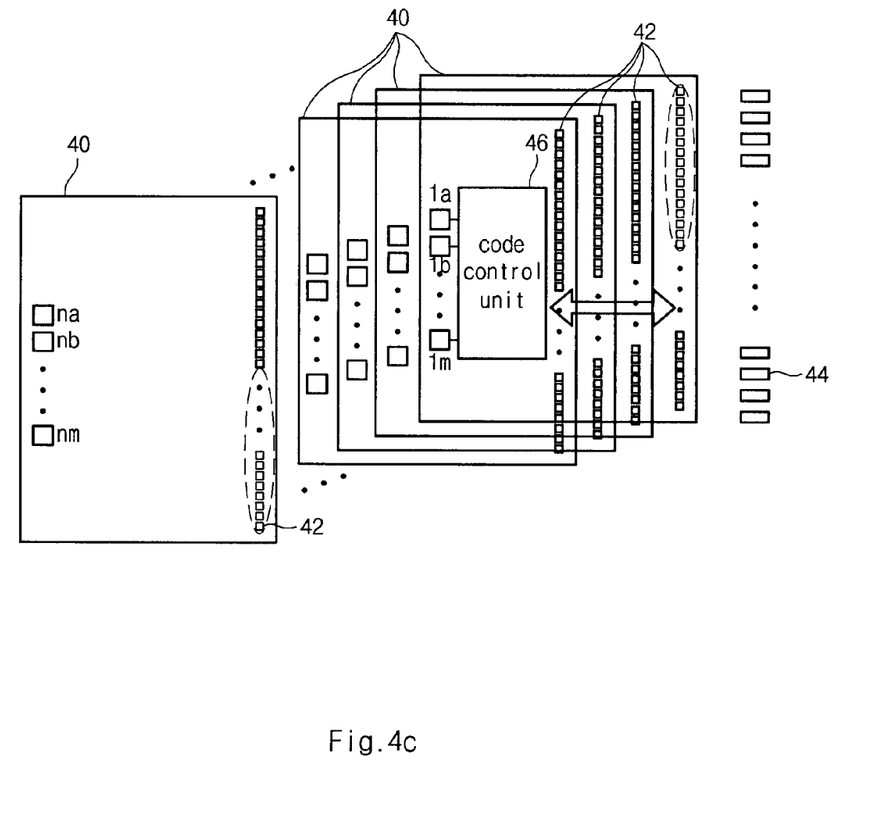

FIGS. 4a through 4c illustrates the connection structure of input/output pads in a semiconductor package (×16) according to an embodiment consistent with the present invention.

FIG. 4a shows a multi-chip package having a two-layered chip structure, the data bandwidth of which is ×16. A semiconductor device of FIG. 4a has a double layered chip 40 structure. Each of chips 40 includes an input/output pad 42 for inputting and outputting data. Input/output pad 42 is electrically connected to a bond finger 44 through a metal wire (not shown).

FIG. 4b shows a multi-chip package having a four-layered chip structure, the data bandwidth of which is ×16. A semiconductor device of FIG. 4b has a four-layered chip 40 structure. Each of chips 40 includes an input/output pad 42 for inputting and outputting data.

FIG. 4c shows a multi-chip package having an n-layered chip structure, the data bandwidth of which is ×16. A semiconductor device of FIG. 4c has an n-layered chip 40 structure. Each of chips 40 includes an input/output pad 42 for inputting and outputting data.

Each chip 40 includes a code control unit 46 for enabling input/output pads 42 positioned at different locations in each die depending on coding information. Each chip 40 includes decoding pads 1a~na, 1m~nm for providing coding information to code control unit 46.

In this embodiment, a multi-chip package, where a plurality of chips are stacked, includes decoding pads 1a~na, 1b~nb, . . . , 1m~nm for decoding code in each die when input/output pads 22, 32, 42 are connected. As a result, input/output pads 22, 32, 42 positioned at different locations in each die are enabled depending on decoding information of the decoding pads 1a~na, 1b~nb, . . . , 1m~nm in the multi-chip package having the same data bandwidth to facilitate package interconnection.

Figure 5:
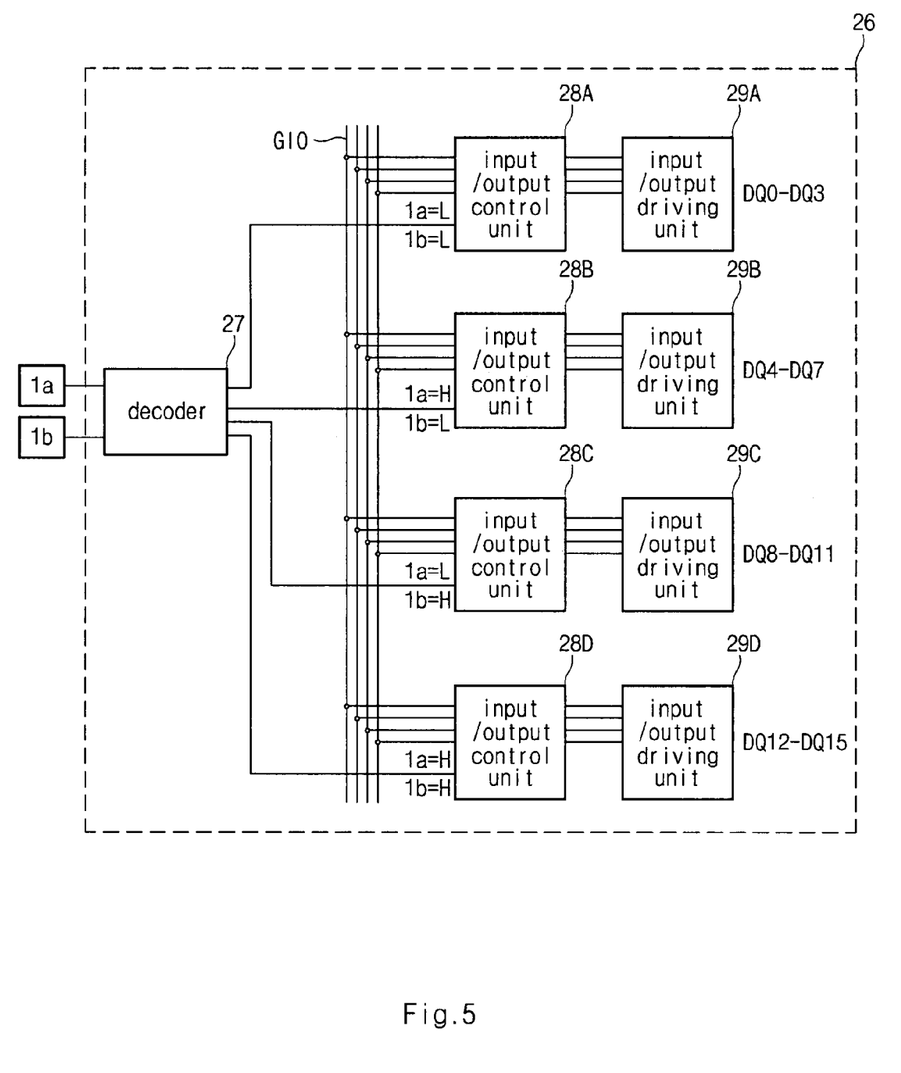
FIG. 5 is a diagram illustrating a code control unit in a semiconductor package (×4) according to an embodiment consistent with the present invention.

FIG. 5 illustrates code control unit 26 in the semiconductor package (×4) according to an embodiment consistent with the present invention.

Code control unit 26 includes a decoder 27, input/output control units 28A~28D, and input/output driving units 29A~29D. Decoder 27 decodes input signals from the decoding pads (1a and 1b). Input/output control units 28A~28D are selectively activated in response to a decoding signal applied from decoder 27 so as to input and output signals of global input/output lines GIO selectively.

In other words, one of input/output control units 28A~28D, which is selected in response to an output signal from decoder 27, inputs and outputs data of global input/output line GIO into input/output pad 22. Input/output driving units 29A~29D selectively drive data DQ0~DQ15 in response to control signals of input/output control units 28A~28D, so as to input and output the data through input/output pad 22.

When the number of chips is two, the number of decoding pads 1a in one chip is one. When the number of chips is four, the number of decoding pads 1a, 1b in one chip is two. When the number of chips is n, the number of decoding pads 1a~1m in one chip is $\log_2 n$, where n is a natural number.

For example, when two chips of data bandwidth ×4 is deposited as shown in FIG. 2a, output signals of decoding pads 1a and 2a are used as code information. That is, when decoding pad 1a positioned in the lower chip is 'high,' decoding pad 2a positioned in the upper chip becomes 'low.'

In the lower chip, input/output pad 22 located at (D) is enabled to input/output data DQ8~DQ11. In the upper chip, input/output pad 22 located at (E) is enabled to input/output data DQ12~DQ15. As a result, input/output pads 22 located at different regions (D) and (E) are enabled to facilitate interconnection between input/output pad 22 and bond finger 24.

When four chips of data bandwidth ×4 are disposed as shown in FIG. 2b, two decoding pads (1a, 1b) (2a, 2b) (3a, 3b) (4a, 4c) in each chip 20 utilize output signals of code control unit 26 as code information.

When decoding pads (1a, 1b) are 'low' in the first chip, data are outputted through corresponding input/output pad 22. When decoding pad 2a is 'high' and decoding pad 2b is 'low' in the second chip, data is inputted and outputted through the corresponding input/output pad 22. When decoding pad 3a is 'low' and decoding pad 3b is 'high' in the third chip, data is inputted and outputted through the corresponding input/output pad 22. When decoding pads (4a, 4b) are 'high' in the fourth chip, data is inputted and outputted through the corresponding input/output pad 22.

When decoding pads (1a, 1b) are 'low', input/output control unit 28A and input/output driving unit 29A are activated in the first chip located at the bottom of chips 20 of the multi-chip package. As a result, data DQ0~DQ3 applied from global input/output line GIO are inputted and outputted through the corresponding input/output pad 22. Reset input/output control units 28B~28D of the first chip are disabled so that data DQ4~DQ15 are not inputted and outputted.

When decoding pad 2a is 'high' and decoding pad 2b is 'low,' input/output control unit 28B and input/output driving unit 29B are activated in the second chip of chips 20 of the multi-chip package. As a result, data DQ4~DQ7 applied from global input/output line GIO are inputted and outputted through the corresponding input/output pad 22. Reset input/output control units 28A, 28C, 28D of the second chip are disabled so that data DQ0~DQ3, DQ8~DQ15 are not inputted and outputted.

When decoding pad 3a is 'low' the decoding pad 3b is 'high,' input/output control unit 28C and input/output driving unit 29C are activated in the third chip of chips 20 of the multi-chip package. As a result, data DQ8~DQ11 applied from global input/output line GIO are inputted and outputted through the corresponding input/output pad 22. Reset input/output control units 28A, 28B, 28D of the third chip are disabled so that data DQ0~DQ7, DQ12~DQ15 are not inputted and outputted.

When decoding pads (4a, 4b) are 'high,' input/output control unit 28D and input/output driving unit 29D are activated in the fourth chip of chips 20 of the multi-chip package. As a result, data DQ12~DQ15 applied from global input/output line GIO are inputted and outputted through the corresponding input/output pad 22. Reset input/output control units 28A~28C of the fourth chip are disabled so that data DQ0~DQ11 are not inputted and outputted.

Although decoder 27, input/output control units 28A~28D, and input/output driving units 29A~29D are not shown in FIG. 5, decoder 27, input/output control units 28A~28D, and input/output driving units 29A~29D can be easily appreciated by a person having ordinary skill in the art.

Figure 6:
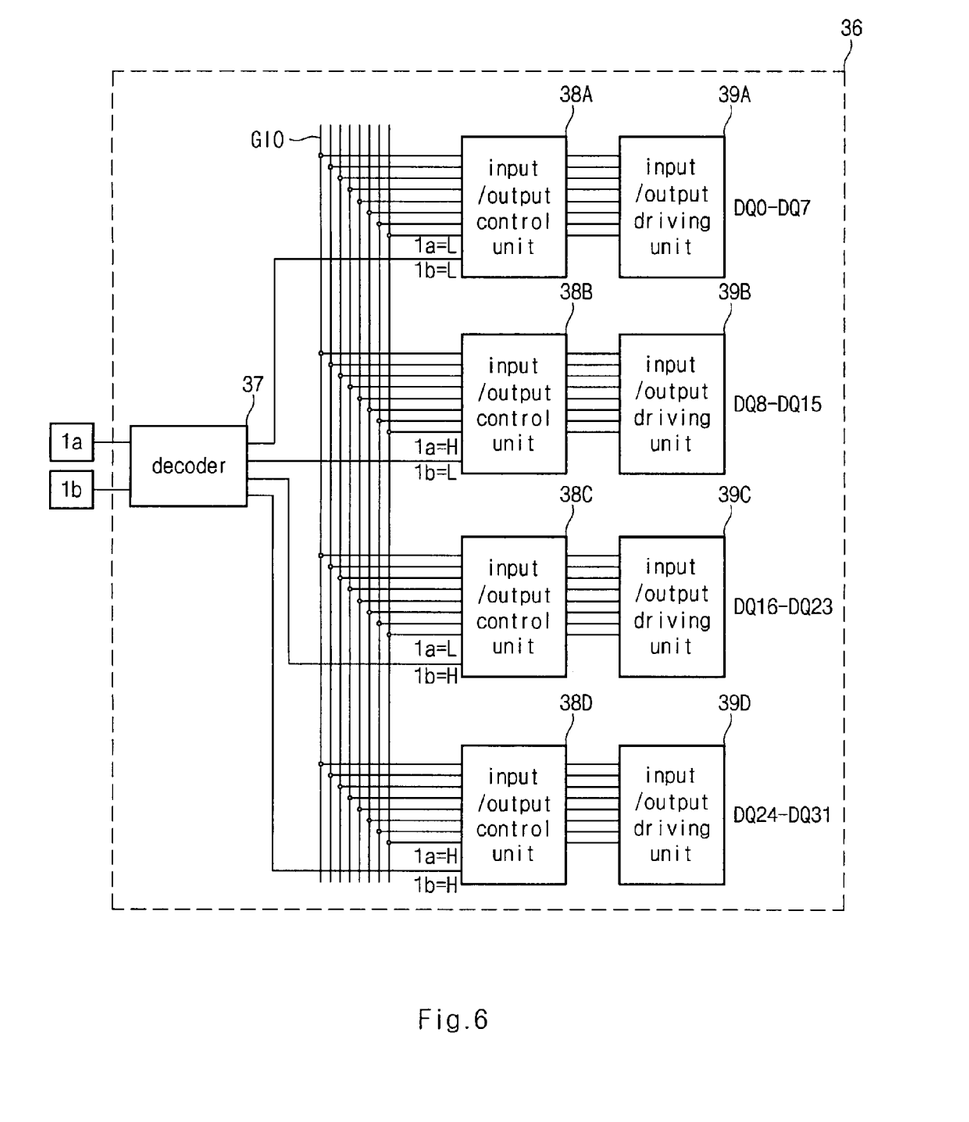
FIG. 6 is a diagram illustrating a code control unit in a semiconductor package (×8) according to an embodiment consistent with the present invention.

FIG. 6 illustrates code control unit 36 in a semiconductor package (×8) according to an embodiment consistent with the present invention.

Code control unit 36 includes a decoder 37, input/output control units 38A~38D, and input/output driving units 39A~39D. Decoder 37 decodes input signals from decoding pads (1a, 1b). Input/output control units 38A~38D are selectively activated in response to a decoding signal applied from decoder 37, so as to input and output signals of global input/output lines GIO selectively. In other words, one of input/output control units 38A~38D, which is selected in response to an output signal from decoder 37, inputs and outputs data of global input/output line GIO into input/output pad 32. Input/output driving units 39A~39D selectively drive data DQ0~DQ31 in response to control signals of input/output control units 38A~38D, so as to input and output data through input/output pad 32.

When decoding pads (1a, 1b) are 'low,' input/output control unit 38A and input/output driving unit 39A are activated in the first chip located at the bottom of chips 30 of the multi-chip package. As a result, data DQ0~DQ7 applied from global input/output line GIO are inputted and outputted through corresponding input/output pad 32. Reset input/output control units 38B~38D of the first chip are disabled so that data DQ8~DQ31 are not inputted and outputted.

When decoding pad 2a is 'high' and decoding pad 2b is 'low,' input/output control unit 38B and input/output driving unit 39B are activated in the second chip of chips 30 of the multi-chip package. As a result, data DQ8~DQ15 applied from global input/output line GIO are inputted and outputted through corresponding input/output pad 32. Reset input/output control units 38A, 38C, 38D of the second chip are disabled so that data DQ0~DQ7, DQ16~DQ31 are not inputted and outputted.

When decoding pad 3a is 'low' and decoding pad 3b is 'high,' input/output control unit 38C and input/output driving unit 39C are activated in the third chip of chips 30 of the multi-chip package. As a result, data DQ16~DQ23 applied from global input/output line GIO are inputted and outputted through the corresponding input/output pad 32. Reset input/output control units 38A, 38B, 38D of the third chip are disabled so that data DQ0~DQ15, DQ24~DQ31 are not inputted and outputted.

When decoding pads (4a, 4b) are 'high,' input/output control unit 38D and input/output driving unit 39D are activated in the fourth chip of chips 30 of the multi-chip package. As a result, data DQ24~DQ31 applied from global input/output line GIO are inputted and outputted through corresponding input/output pad 32. Reset input/output control units 38A~38C of the fourth chip are disabled so that data DQ0~DQ23 are not inputted and outputted.

Although decoder 37, input/output control units 38A~38D, and input/output driving units 39A~39D are not shown in FIG. 6, decoder 37, input/output control units 38A~38D, and input/output driving units 39A~39D can be easily appreciated by a person having ordinary skill in the art.

In this embodiment, code control units 26 and 36 may be applied to the semiconductor package having a four-layered structure chip, the data bandwidth of which is ×4 and ×8. However, when the data bandwidth is ×4, ×8, ×16, etc., the present invention can be easily designed. When the chip of the semiconductor package is two-layered, four-layered, etc., the code control unit can be designed.

Although one embodiment consistent with the present invention is applied to a stack or multi-chip package, it is appreciated that there are other embodiments, which are applicable to a DRAM+DRAM structure, DRAM+NAND flash structure, and System In Packaged (SIP) such as DRAM+controller.

As described above, according to an embodiment consistent with the present invention, input/output pads positioned at different locations in each die are selected in a stack or multi-chip package including two or more chips so as to facilitate package connection. Due to the optimization of the interconnection line, the loading of the input/output pads can be minimized.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A semiconductor package including a plurality of chips, wherein each of the chips include:
   input/output pads configured to input and output data at a given bandwidth;
   a decoding pad configured to receive coding information; and
   a code control unit configured to decode the coding information to obtain a decoding result, and to enable an input/output pad positioned at a specific location among the input/output pads according to the decoding result, wherein a location of an enabled input/output pad of one chip is different from a location of an enabled input/output pad of another chip.

2. The semiconductor package according to claim 1, wherein each chip includes one decoding pad, if there are two chips.

3. The semiconductor package according to claim 1, wherein each chip includes two decoding pads, if there are four chips.

4. The semiconductor package according to claim 1, wherein each chip includes $\log_2 n$ decoding pads, if there are n chips, where n is a natural number.

5. The semiconductor package according to claim 1, wherein the code control unit includes:

a decoder configured to decode the coding information to obtain the decoding result; and a plurality of input/output control units configured to input and output data of global input/output lines through the input/output pad selected according to the decoding result.

6. The semiconductor package according to claim 5, wherein the code control unit further comprises a plurality of input/output driving units configured to drive output signals from the plurality of input/output control units and the input/output pads.

7. The semiconductor package according to claim 6, wherein the input/output driving units correspond one by one to the input/output control units.

8. The semiconductor package according to claim 5, wherein one of the input/output control units is enabled, the enabled input/output unit being selected depending on the decoding information.

9. The semiconductor package according to claim 5, wherein each of the input/output control units outputs data with the same data bandwidth corresponding to the number of the global input/output lines.

10. The semiconductor package according to claim 1, wherein the chips are DRAM chips.

11. The semiconductor package according to claim 1, wherein each of the chips is configured to have a DRAM+NAND flash structure.

12. The semiconductor package according to claim 1, wherein each of the chips is configured to have a DRAM+controller structure.

13. The semiconductor package according to claim 1, wherein each of the chips is configured to have a System In Package (SIP) structure.

* * * * *